(12) United States Patent
Hisa et al.

(10) Patent No.: US 7,550,673 B2
(45) Date of Patent: Jun. 23, 2009

(54) ELECTRODE PATTERN AND WIRE BONDING METHOD

(75) Inventors: Yoshihiro Hisa, Tokyo (JP); Tsutomu Yamaguchi, Tokyo (JP); Hideyuki Tanaka, Tokyo (JP); Kazunori Matsuo, Nagasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/042,650

(22) Filed: Mar. 5, 2008

(65) Prior Publication Data

US 2008/0230255 A1 Sep. 25, 2008

(30) Foreign Application Priority Data

Mar. 19, 2007 (JP) .............................. 2007-070684
Jan. 17, 2008 (JP) .............................. 2008-008066

(51) Int. Cl.
*H01R 4/18* (2006.01)

(52) U.S. Cl. .................................... 174/94 R; 257/738

(58) Field of Classification Search ............... 174/94 R; 257/738, 778, 781
See application file for complete search history.

(56) References Cited

U.S. PATENT DOCUMENTS 6,144,102 A * 11/2000 Amagai ....................... 257/781
2005/0151251 A1 * 7/2005 Adachi et al. ............... 257/738

FOREIGN PATENT DOCUMENTS

JP 2001-326241 11/2001

* cited by examiner

*Primary Examiner*—Chau N Nguyen
(74) *Attorney, Agent, or Firm*—Leydig, Voit & Mayer, Ltd.

(57) ABSTRACT

An electrode pattern for wire-bonding includes: a wire-bonding reference pattern indicating a reference position for determination of a wire-bonding position; and a wire-bonding recognition pattern. The distance between the reference position and a wire-bonding metal portion bonded to the electrode pattern and the distance between the wire-bonding recognition pattern and the wire-bonding metal portion satisfy predetermined relationships.

8 Claims, 5 Drawing Sheets

ELECTRODE PATTERN AND WIRE BONDING METHOD

BACKGROUND OF THE INVENTION

1. Field of the Invention

The present invention relates to an electrode pattern for wire bonding to an electrode of a semiconductor device, a substrate, or the like and to a wire bonding method.

2. Background Art

For wire-bonding metal wires to electrodes, it is necessary to teach a bonding position to a bonding apparatus. When wire bonding is performed by using an Au ball, for example, usually a design is made so that each Au ball is within a wire-bonding electrode with sufficient margins. A technique for allowing a wire bonding apparatus to recognize a bonding position in a wire bonding process of manufacture of a semiconductor device is disclosed in JP-A-2001-326241.

A wire-bonding electrode pattern of a laser diode has a long and narrow shape. In recording laser diodes, whereas the optical output that is required for laser diodes increases as the recording speed increases, there is strong demand for price reduction. Some attempts have being made to meet these requirements. To attain a high output power, laser diodes are elongated in the longitudinal direction. To attain price reduction, laser diodes are shortened in the lateral direction so that the number of chips taken from one wafer is increased. For example, in high-output-power (350-mW-class) recording laser diode has very long and narrow shape which is more than 2,000 μm in the longitudinal direction and less than 150 μm in the lateral direction.

A high-output-power recording laser diode is mounted in a package in the following manner. A submount and a laser diode are bonded to an eyelet with AuSn solder or the like. The electrode of the laser diode is wire-bonded to a lead or the eyelet. To form an Au ball at a prescribed position on the electrode, a characteristic pattern of an electrode end portion is recognized and an Au ball is then bonded to the electrode at a position that is shifted from the characteristic pattern by a prescribed length. It is known that when the submount and the laser diode are bonded to the eyelet, the center line of the laser diode can be inclined from that of the eyelet by about 2° at the maximum due to the accuracy of an assembling apparatus.

SUMMARY OF THE INVENTION

If the center line of the laser diode is not inclined at all from that of the eyelet, an Au ball can be bonded to the electrode on its center line. However, there is a problem that an Au ball bulges out of the electrode when an inclination exists. When the electrode is long in the longitudinal direction and short in the shorter-axis direction (i.e., the electrode width is small), a large deviation occurs in the shorter-axis direction and the bulging length of an Au ball becomes large. The bulging length of an Au ball can be made small if it is formed in the vicinity of an electrode end portion. However, this leads to a problem that the density of current that can be supplied to the laser diode at a position that is distant from the Au ball is made different from that in the vicinity of the Au ball. In this case, the laser diode hardly operates normally. Therefore, it is necessary that an Au ball be formed near the center of the laser diode. This phenomenon is more remarkable in the case where an Au ball is formed on a long and narrow electrode pattern as in the case of high-output-power recording laser diodes.

An aspect of the present invention has been made in view of the above mentioned circumstances and provides an electrode pattern and a wire bonding method which make it possible to perform wire bonding with high accuracy.

An aspect of the present invention provides an electrode pattern for wire-bonding including:
a shorter sideline;
a longer sideline;
a wire-bonding reference pattern indicating a reference position for determination of a wire-bonding position; and
a wire-bonding recognition pattern,
wherein the following relationships are satisfied, $$L^3 14.3(W-3d/4), \text{ and}$$

$$Lb £ 14.3(W-3d/4),$$

where

L indicates a distance between (i) the reference position and (ii) a line that is parallel with the shorter sideline of the electrode pattern and passes through a position where a wire-bonding metal portion bonded to the electrode pattern has a maximum width in a direction parallel with the shorter sideline of the electrode pattern, Lb indicates a distance between (i) a line that passes through a center, in a direction parallel with the longer sideline of the electrode pattern, of the wire-bonding recognition pattern and is parallel with the shorter sideline of the electrode pattern and (ii) the line that is parallel with the shorter sideline of the electrode pattern and passes through the position where the wire-bonding metal portion has the maximum width in the direction parallel with the shorter sideline of the electrode pattern, d indicates a maximum width of the wire-bonding metal portion bonded to the electrode pattern in the direction parallel with the shorter sideline of the electrode pattern, and W indicates a width of the electrode pattern in the direction parallel with the shorter sideline of the electrode pattern.

According to the above configuration, it is possible to obtain a long and narrow electrode pattern which allows a wire-bonding wire to be bonded to the electrode pattern at an arbitrary position.

BRIEF DESCRIPTION OF THE DRAWINGS

Embodiments of the present invention will be described in detail based on the following figures, wherein.

DETAILED DESCRIPTION OF THE PREFERRED EMBODIMENTS

First Embodiment

Figure 1:
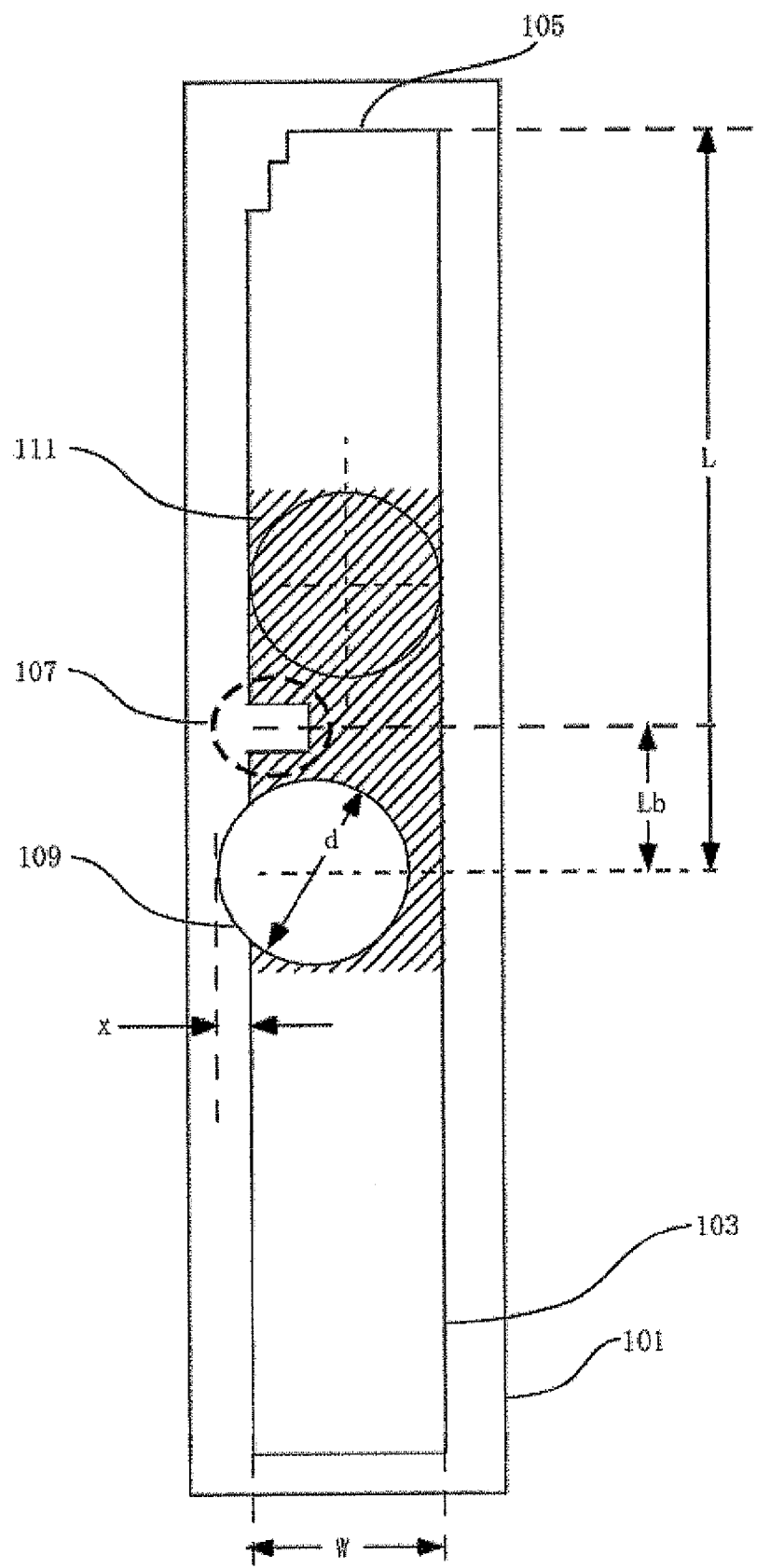
FIG. 1 is a schematic diagram of an electrode pattern according to a first embodiment of the present invention.
Figure 2A:
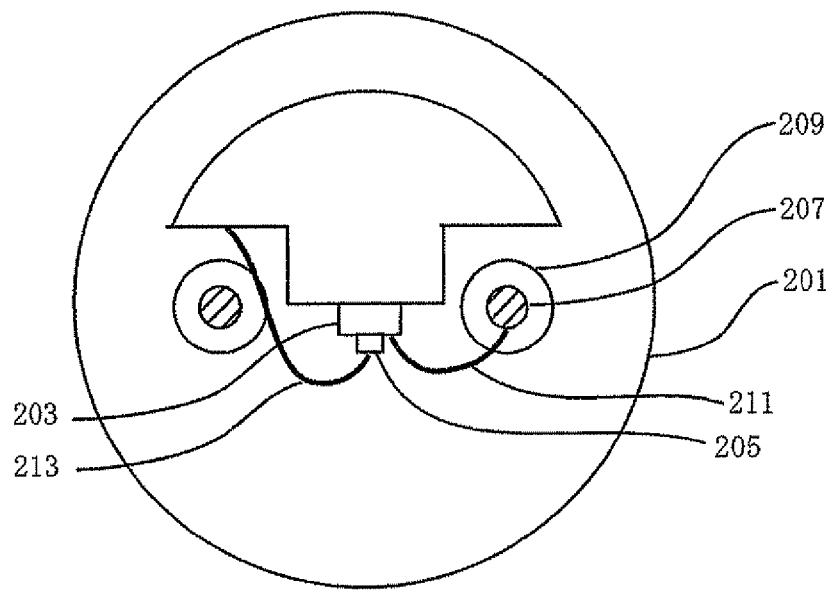
FIGS. 2A and 2B are schematic diagrams of a semiconductor device using the electrode pattern according to the first embodiment.
Figure 2B:
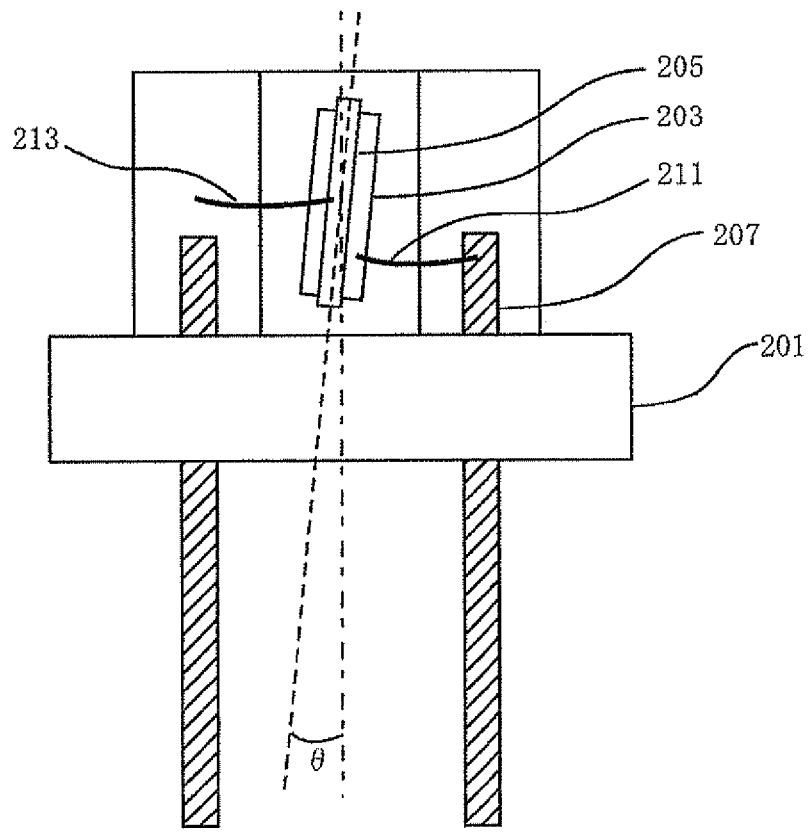

FIG. 1 is a schematic diagram of a wire-bonding electrode pattern according to a first embodiment of the present invention. FIGS. 2A and 2B are schematic diagrams of a semiconductor device using the wire-bonding electrode pattern according to the first embodiment. A description will be made with reference to FIGS. 1, 2A and 2B. The first embodiment of the present invention is directed to a semiconductor device which is formed by performing wire-bonding on a long and narrow laser diode chip. A wire-bonding electrode pattern 103 is formed in the laser diode chip. Wire bonding is performed by forming an Au ball 109 having a diameter d in a wire-bonding area 111 on the electrode pattern 103. In the bonding, if the center line of the laser diode 205 is not inclined at all from that of an eyelet 201 (i.e., $\theta=0$; see FIG. 2B), the Au ball 109 is formed so that the center thereof is located on a line that is parallel with the longer sideline of the electrode pattern 103 and passes through a center, in a direction parallel with the shorter sideline of the electrode pattern 103, of the electrode pattern 103. The electrode pattern 103 is formed with a wire-bonding recognition pattern 107 as a characteristic pattern. In this embodiment, the wire-bonding recognition pattern 107 is a rectangular cut that is formed adjacent to one longer sideline of the electrode pattern 103. Individual dimensions are defined as follows.

L: The shortest distance between an edge (electrode edge 105) of the electrode pattern 103 and the center of the Au ball 109 formed in the wire bonding area 111.

Lb: The shortest distance between the center line, in the direction parallel with the longer sideline of the electrode pattern 103, of the wire-bonding recognition pattern 107 which is parallel with the shorter sidelines of the electrode pattern 103 and the center of the Au ball 109 formed in the wire bonding area 111.

d: The diameter of the Au ball 109.

W: The width of the electrode pattern 103 in the shorter-axis direction thereof.

The inclination (deviation) $\theta$ of the center line of the laser diode 205 from that of the eyelet 201 can be 2° at the maximum and depends on the accuracy of an assembling apparatus. A length x by which the Au ball 109 bulges out of the wire bonding area 111 when the Au ball 109 is formed in the wire bonding area 111 is given by the following equation:

$x = d/2 - W/2 + L \tan \theta$

If the maximum allowable value of the bulging length x is set at d/8, corresponding values of L and Lb are given by the following equations since $\tan 2° = 0.0349$:

$L = 14.3(W - 3d/4)$ $Lb = 14.3(W - 3d/4)$

In this embodiment, the electrode edge 105 is employed as a wire bonding reference pattern which is a reference for determination of a wire bonding position. Wire bonding is performed at such a position that the distance L between this wire bonding reference pattern and the center of the Au ball 109 having the diameter d and formed in the wire bonding area 111 satisfies a relationship:

$L \geq 14.3(W - 3d/4)$.

At this time, positioning is performed so that the distance Lb between the center line, in the direction parallel with the longer sideline of the electrode pattern 103, of the wire-bonding recognition pattern 107 (formed in the electrode pattern 103) which is parallel with the shorter sidelines of the electrode pattern 103 and the center of the Au ball 109 satisfies a relationship $Lb \leq 14.3(W - 3d/4)$.

For example, in a high-output-power recording laser diode in which the longitudinal length is 2,000 µm, the width is 120 µm, and the electrode width is 80 µm, if the Au ball diameter is 80±10 µm, the distance L is about 286 µm. Therefore, without the wire-bonding recognition pattern, an Au ball can be formed only near the edge of the long and narrow electrode. As a result, the density of current injected in an electrode top portion is made different from that of current injected in an electrode bottom portion, and the operation of the laser diode is rendered unstable. According to this embodiment, since the wire-bonding recognition pattern 107 is provided at a desired position, it possible to easily prevent non-uniformity of the density of current injected.

Although in this embodiment the electrode edge 105 is used as the wire bonding reference pattern, characteristic patterns of the electrode other than the electrode edge can be used as the wire-bonding reference pattern. For example, a cut, which is formed in the electrode pattern 103 at one of the four corners to enable, for example, discrimination between the front portion and the rear portion of the chip, can be used as the wire-bonding reference pattern. In this embodiment, this cut is a combination of rectangles, it may have other shapes such as a circle and a triangle. Although in this embodiment wire bonding is performed by forming an Au ball 109, in the case of wedge bonding, Au ball is not formed and, instead, a tip portion of a wire is subjected to ultrasonic pressure bonding. In this case, the end portion of a wire is crushed and bonded to the electrode pattern 103.

In the first embodiment, d indicates the diameter of the Au ball 109. However, when the Au ball 109 has not a circular shape, d is defined as a maximum width of the Au ball 109 in the direction parallel with the shorter sideline of the electrode pattern. L is defined as a distance between the wire bonding reference pattern and a line that is parallel with a shorter sideline of the electrode pattern 103 and passes through a position where the Au ball 109 has the maximum width in a direction parallel with the shorter sideline of the electrode pattern 103. Lb is defined as a distance between a line that passes through a center, in a direction parallel with the longer sideline of the electrode pattern, of the wire-bonding recognition pattern 107 and is parallel with the shorter sideline of the electrode pattern and the line that is parallel with the shorter sideline of the electrode pattern 103 and passes through a position where the Au ball 109 has the maximum width in a direction parallel with the shorter sideline of the electrode pattern 103.

Second Embodiment

Figure 3:
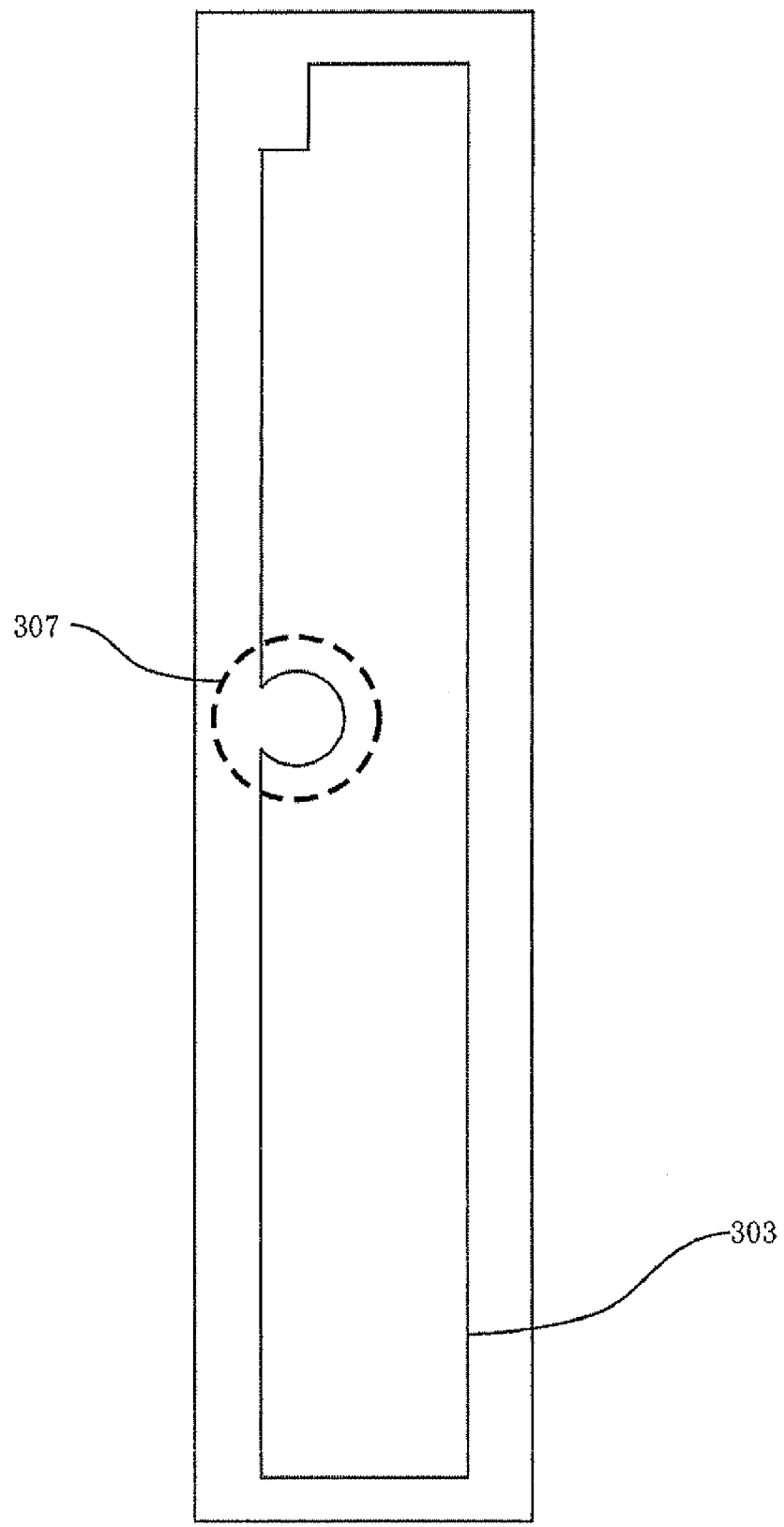
FIG. 3 is a schematic diagram of an electrode pattern according to a second embodiment of the present invention.
Figure 4:
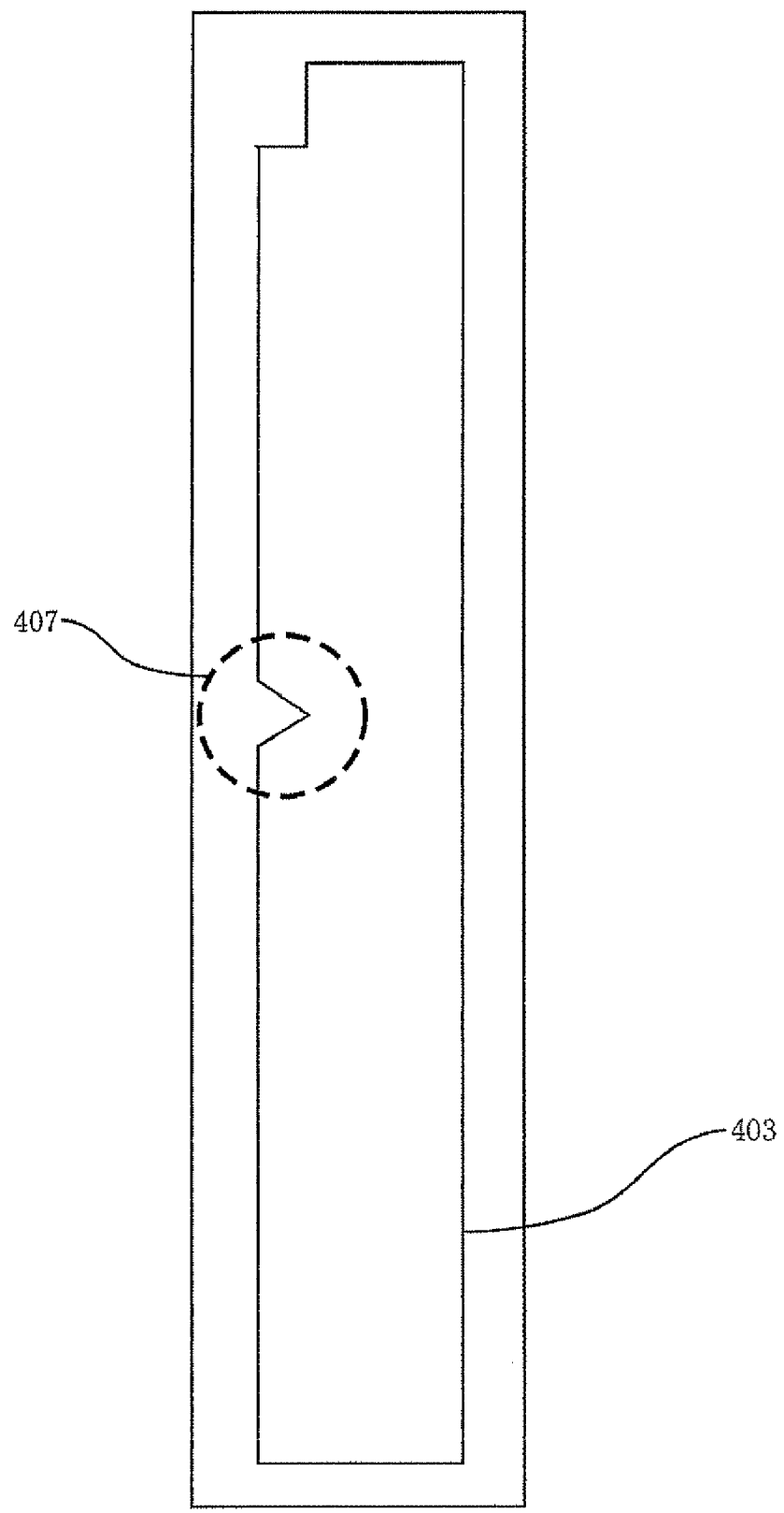
FIG. 4 is a schematic diagram of another electrode pattern according to the second embodiment.

FIGS. 3 and 4 are schematic diagrams of wire-bonding electrode patterns according to a second embodiment of the present invention. Whereas in the first embodiment the wire-bonding recognition pattern 107 is a rectangular cut (see FIG. 1), this embodiment employs a circular wire-bonding recognition pattern shown in FIG. 3 or a triangular wire-bonding recognition pattern shown in FIG. 4. In the case of the circular wire-bonding recognition pattern 307, even if it is made small or etching-induced rounding occurs when an etching method that is low in working accuracy is used, the shape of the wire-bonding recognition pattern 307 is kept circular and hence a recognition error can be avoided. In the case of the triangular wire-bonding recognition pattern 407, the straight portions can be made longer than those of a rectangular shape having the same size, which provides an advantage that the influence of pattern deterioration by etching-induced rounding or the like can be reduced.

Figure 5A:
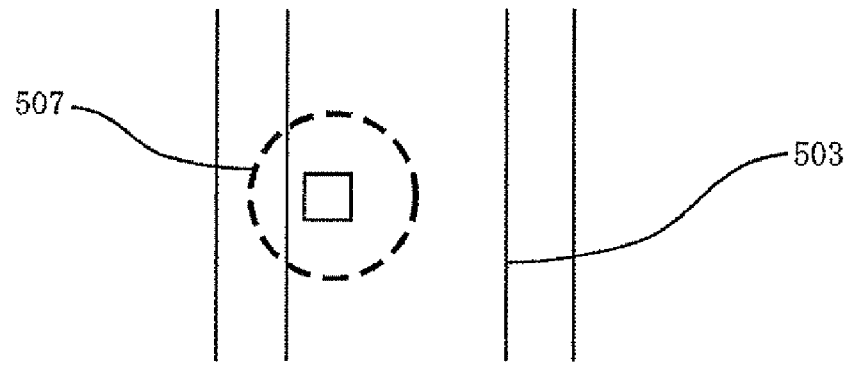
FIGS. 5A, 5B and 5C are schematic diagrams of further electrode patterns according to the second embodiment.
Figure 5B:
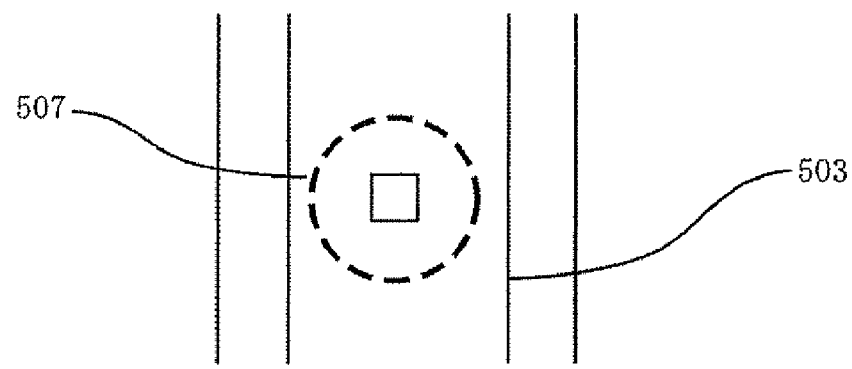
Figure 5C:
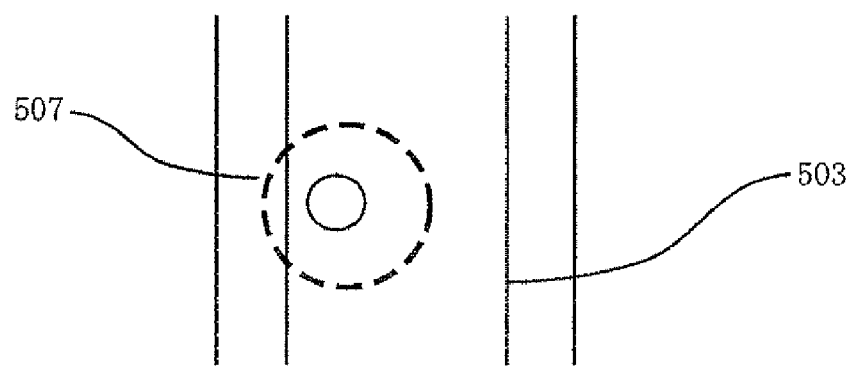

Since each of the wire-bonding recognition patterns 307 and 407 is formed adjacent to one longer sideline of the electrode pattern 303 or 304, it can be formed easily by a lift-off method. Where etching or a like method is used, a wire-bonding recognition pattern 507 may be formed inside an electrode pattern 503 as shown in FIGS. 5A, 5B and 5C.

Third Embodiment

This embodiment is directed to a method for performing wire-bonding by recognizing a wire-bonding recognition pattern.

Referring to FIG. 2, an approximate position of the wire-bonding recognition pattern 107 can be recognized by recognizing the external shape of the eyelet 201. Then, the wire-bonding recognition pattern 107 of the electrode pattern 103 is recognized to determine a wire-bonding position. At this time, if necessary, the wire-bonding recognition pattern 107 is recognized with the magnification of the camera changed. Finally, wire bonding is performed by using wires 211 and 213 and connections are thereby made to a lead 207 and the ground based on the determined wire-bonding position. This method makes it possible to immediately find the laser diode 205 being deviated from the prescribed position due to miss-setting, a pre-alignment failure, a failure of a positioning jig, or the like. That is, since it is found after recognition of the external shape of the eyelet 201 that no wire-bonding recognition pattern exists at the expected position, the operation of the apparatus is stopped upon the finding. This minimizes the number of defective products having positional errors which are produced in the laser diode bonding process, and hence provides an advantage that a loss caused by continuing production of defective products is prevented.

Fourth Embodiment

This embodiment is directed to another method for performing wire-bonding by recognizing a wire-bonding recognition pattern.

As in the third embodiment, an approximate position of the wire-bonding recognition pattern 107 can be recognized by recognizing the external shape of the eyelet 201. Then, the wire-bonding reference pattern as the reference of a wire-bonding position is recognized. In this embodiment, the electrode edge 105 is used as the wire-bonding reference pattern. Then, the wire-bonding recognition pattern 107 of the electrode pattern 103 is recognized to determine a wire-bonding position. At this time, if necessary, the wire-bonding recognition pattern 107 is recognized with the magnification of the camera changed. Finally, wire bonding is performed based on the determined wire-bonding position. Since the chip position is recognized beforehand, this method makes it possible to recognize the position of the wire-bonding recognition pattern 107 more accurately than in the third embodiment. Furthermore, the cut that is formed in the electrode pattern 103 at one of the four corners can be used for position recognition as the wire-bonding reference pattern. Although in this embodiment this cut is a combination of rectangles, it may have other shapes such as a circle and a triangle.

Fifth Embodiment

This embodiment is directed to a further method for performing wire-bonding by recognizing a wire-bonding recognition pattern.

First, an approximate position of the wire-bonding recognition pattern 107 can be recognized by recognizing the external shape of the eyelet 201 (see FIG. 1). Then, the wire-bonding recognition pattern 107 of the electrode pattern 103 is recognized to determine a wire-bonding position. At this time, if necessary, the wire-bonding recognition pattern 107 is recognized with the magnification of the camera changed. Then, the pattern of the electrode edge 105 which should be located at the expected position is recognized. Finally, wire bonding is performed based on the determined wire-bonding position. In addition to being capable of detecting a positional error occurring in the bonding process as in the third embodiment, this embodiment can immediately detect a failure that a laser diode chip of another type has been bonded. Laser diode chips have different longitudinal lengths depending on the optical output power. Therefore, the pattern of the electrode edge of the chip of a different type cannot be recognized and hence the apparatus is stopped. As such, this method has an advantage that a loss that is caused by continuing to produce products having a failure that a different chip is mounted. Furthermore, the cut that is formed in the electrode pattern 103 at one of the four corners can be used for position recognition. Although in this embodiment this cut is a combination of rectangles, it may have other shapes such as a circle and a triangle.

The present invention relates to an electrode pattern having shorter sideline and longer sideline. The effect of the inclined displacement of the center line of a laser diode relative to the center line of an eyelet is increased when the width W of the electrode pattern in the shorter sideline direction is smaller. Although the margin to the displacement becomes greater when W is larger, the margin substantially disappears when W is not more than 100 µm. Therefore, the present invention especially exerts the effect when W is not more than 100 µm.

Although several embodiments according the present invention has been described above as being directed to the high-output-power recording laser diodes, the present invention can also be applied to electrode patterns to be subjected to wire bonding such as wiring patterns of red laser diodes, bluish-purple laser diodes, communications laser diodes, LEDs, other semiconductor devices, packages, substrates, etc.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-070684, filed Mar. 19, 2007 and a Japanese Patent Application No. 2008-008066, filed on Jan. 17, 2008 including specification, claims, drawings and summary, on which the Convention priority of the present application is based, are incorporated herein by reference in its entirety.

What is claimed is:

1. An electrode pattern for wire-bonding, comprising:
   a shorter sideline;
   a longer sideline;
   a wire-bonding reference pattern indicating a reference position for determination of a wire-bonding position; and
   a wire-bonding recognition pattern,
   wherein the following relationships are satisfied, $L \geq 14.3(W-3d/4)$, and $Lb \leq 14.3(W-3d/4)$, where
   L indicates a distance between (i) the reference position and (ii) a line that is parallel with the shorter sideline of the electrode pattern and passes through a position where a wire-bonding metal portion bonded to the electrode pattern has a maximum width in a direction parallel with the shorter sideline of the electrode pattern,
   Lb indicates a distance between (i) a line that passes through a center, in a direction parallel with the longer sideline of the electrode pattern, of the wire-bonding recognition pattern and is parallel with the shorter sideline of the electrode pattern and (ii) the line that is parallel with the shorter sideline of the electrode pattern and passes through the position where the wire-bonding metal portion has the maximum width in the direction parallel with the shorter sideline of the electrode pattern, d indicates a maximum width of the wire-bonding metal portion bonded to the electrode pattern in the direction parallel with the shorter sideline of the electrode pattern, and W indicates a width of the electrode pattern in the direction parallel with the shorter sideline of the electrode pattern.

2. The electrode pattern according to claim 1, wherein the wire-bonding reference pattern is an edge of the electrode pattern.

3. The electrode pattern according to claim 1, wherein the wire-bonding metal portion bonded to the electrode pattern includes an Au ball.

4. The electrode pattern according to claim 1, wherein the wire-bonding metal portion bonded to the electrode pattern includes an. end portion of a wire, the end portion being crushed for wedge bonding.

5. The electrode pattern according to claim 1, wherein the W is not more than 100 μm.

6. A wire bonding method for wire bonding to the electrode pattern according to claim 1, comprising:

recognizing an external shape of a package accommodating the electrode pattern;

determining a wire-bonding position by recognizing the wire-bonding recognition pattern after recognizing the external shape of the package; and performing wire-bonding based on the determined wire-bonding position.

7. A wire bonding method for wire bonding to the electrode pattern according to claim 1, comprising:

recognizing an external shape of a package accommodating the electrode pattern;

recognizing the wire-bonding reference pattern after recognizing the external shape of the package;

determining a wire-bonding position by recognizing the wire-bonding recognition pattern; and performing wire-bonding based on the determined wire-bonding position after recognizing the wire-bonding recognition pattern.

8. A wire bonding method for wire bonding to the electrode pattern according to claim 1, comprising:

recognizing an external shape of a package accommodating the electrode pattern;

determining a wire-bonding position by recognizing the wire-bonding recognition pattern after recognizing the external shape of the package;

recognizing a pattern of an edge of the electrode pattern; and performing wire-bonding based on the determined wire-bonding position after recognizing the pattern of the edge of the electrode pattern.

* * * * *